United States Patent [19]
Akram et al.

[11] Patent Number: 5,686,317
[45] Date of Patent: *Nov. 11, 1997

[54] METHOD FOR FORMING AN INTERCONNECT HAVING A PENETRATION LIMITED CONTACT STRUCTURE FOR ESTABLISHING A TEMPORARY ELECTRICAL CONNECTION WITH A SEMICONDUCTOR DIE

[75] Inventors: Salman Akram, Boise; Warren M. Farnworth, Nampa; Alan G. Wood, Boise, all of Id.

[73] Assignee: Micron Technology, Inc., Boise, Id.

[*] Notice: The term of this patent shall not extend beyond the expiration date of Pat. No. 5,483,741.

[21] Appl. No.: 387,687

[22] Filed: Feb. 13, 1995

Related U.S. Application Data

[63] Continuation-in-part of Ser. No. 137,675, Oct. 14, 1993, abandoned, which is a continuation-in-part of Ser. No. 709,858, Jun. 4, 1991, abandoned, Ser. No. 788,065, Nov. 5, 1991, Pat. No. 5,440,240, and Ser. No. 981,956, Nov. 24, 1992, Pat. No. 5,539,324.

[51] Int. Cl.⁶ .................................................. H01L 21/66
[52] U.S. Cl. ..................... 437/8; 437/183; 437/189; 29/846; 29/842
[58] Field of Search ..................... 437/8, 183, 188, 437/189, 200; 29/846, 842

[56] References Cited

U.S. PATENT DOCUMENTS

| | | | |
|---|---|---|---|
| 4,937,653 | 6/1990 | Blonder | 357/68 |
| 4,952,272 | 8/1990 | Okino et al. | 156/630 |
| 5,073,117 | 12/1991 | Malhi | 439/71 |
| 5,177,438 | 1/1993 | Littlebury et al. | 324/158 P |
| 5,177,439 | 1/1993 | Liu et al. | 324/158 P |
| 5,323,035 | 6/1994 | Leedy | 257/248 |
| 5,326,428 | 7/1994 | Farnworth et al. | 156/654 |
| 5,442,196 | 8/1995 | Nishino et al. | 257/36 |
| 5,475,280 | 12/1995 | Jones et al. | 313/309 |
| 5,478,779 | 12/1995 | Akram | 437/189 |
| 5,483,741 | 1/1996 | Akram et al. | 437/8 |
| 5,523,697 | 6/1996 | Farnworth et al. | 437/8 |

FOREIGN PATENT DOCUMENTS 205301  6/1991  Japan.

Primary Examiner—John Niebling
Assistant Examiner—Kevin Turner
Attorney, Agent, or Firm—Stephen A. Gratton

[57] ABSTRACT

A method for forming an interconnect for establishing a temporary electrical connection with contact locations (e.g., bond pads) on a semiconductor die is provided. The interconnect includes a substrate (e.g., silicon) having raised contact members that correspond to the contact locations on the die. Each raised contact member includes one or more projections adapted to penetrate the contact locations on the die to a limited penetration depth. The raised contact member and projections are covered with a metal silicide layer formed using a salicide process. The metal silicide layer is in contact with conductive traces formed on the substrate of a highly conductive metal. Alternately the raised contact members and projections can be formed as a metal layer or as a bi-metal stack.

41 Claims, 17 Drawing Sheets

5,686,317

METHOD FOR FORMING AN INTERCONNECT HAVING A PENETRATION LIMITED CONTACT STRUCTURE FOR ESTABLISHING A TEMPORARY ELECTRICAL CONNECTION WITH A SEMICONDUCTOR DIE

CROSS REFERENCE TO RELATED APPLICATIONS

This application is a continuation-in-part of application Ser. No. 08/137,675 filed Oct. 14, 1993, abandoned, which is a continuation-in-part of application Ser. No. 07/709,858 filed Jun. 4, 1991, abandoned; application Ser. No. 07/788, 065 filed Nov. 5, 1991 now U.S. Pat. No. 5,440,240; and application Ser. No. 07/981,956 filed Nov. 24, 1992, now U.S. Pat. No 5,539,324.

This application is related to applications Ser. No. 08/335, 267 filed Nov. 7, 1994, now U.S. Pat. No. 5,483,741; Ser. No. 08/206,747 filed Mar. 4, 1994, now U.S. Pat No 5,523,697; Ser. No. 08/073,005 filed Jun. 7, 1993, now U.S. Pat. No. 5,408,190; Ser. No 08/124,899 filed Sep. 21, 1993, now U.S. Pat. No. 5,495,179 Ser. No 08/046,675; filed Apr. 14, 1993, now U.S. Pat. No 5,367,253 Ser. No 08/073,003; filed Jun. 7, 1993, now abandoned Ser. No. 08/120,628; filed Sep. 13, 1993,now abandoned Ser. No. 08/192,023; filed Feb. 3, 1994; Ser. No. 07/896,297 filed Jun. 10, 1992, now U.S. Pat. No;. 5,424,652 Ser No 08/192,391; filed Feb. 3, 1994, now U.S. Pat. No. 5,483,174; and Ser. No. 08/137,675 filed Oct. 14, 1993.

FIELD OF THE INVENTION

This invention relates to semiconductor manufacture and to methods for forming an interconnect for establishing a temporary electrical connection with a semiconductor die.

Background of the Invention

Because of a trend towards multi-chip modules, semiconductor manufacturers are required to supply unpackaged dice that have been tested and certified as known good die (KGD). Known good die is a collective term that denotes unpackaged die having the same reliability as the equivalent packaged die.

The need for known good die has led to the development of test apparatus in the form of temporary carriers suitable for testing discrete, unpackaged semiconductor dice. As an example, test apparatus for conducting burn-in tests for discrete die are disclosed in U.S. Pat. No. 4,899,107 to Corbett et al. and U.S. Pat. No. 5,302,891 to Wood et al., which are assigned to Micron Technology, Inc. Other test apparatus for discrete die are disclosed in U.S. Pat. No. 5,123,850 to Elder et al., and U.S. Pat. No. 5,073,117 to Malhi et al., which are assigned to Texas Instruments.

With this type of test apparatus, a non-permanent electrical connection must be made between contact locations on the die, such as bend pads, and external test circuitry associated with the test apparatus. The bend pads provide a connection point for testing the integrated circuitry formed on the die.

In making this temporary electrical connection, it is desirable to effect a connection that causes as little damage as possible to the bend pad. If the temporary connection to a bend pad damages the pad, the entire die may be rendered as unusable. This is difficult to accomplish because the connection must also produce a low resistance or ohmic contact with the bend pad. A bend pad typically includes a metal oxide layer that must be penetrated to make an ohmic contact.

Some prior art contact structures, such as probe cards, scrape the bend pads which wipes away the oxide layer and causes excessive damage to the bend pads. Other interconnect structures such as probe tips may pierce beth the oxide layer and the metal bend pad and leave a deep gouge. Still other interconnect structures, such as microbumps, may not even pierce the oxide layer preventing the formation of an ohmic contact.

Another important consideration in testing of known good die is the effect of thermal expansion during the test procedure. As an example, during burn-in testing, a die is heated to an elevated temperature and maintained at temperature for a prolonged period. This causes thermal expansion of the die and temporary interconnect. If the die and the temporary interconnect expand by a different amount, stress may develop at the connection point and adversely effect the electrical connection. This may also lead to excessive damage of bond pads.

In the past, following testing of a die, it is sometimes necessary to fellow the bond pads, which are typically damaged by the test procedure. This is an additional process step which adds to the expense and complexity of the testing process. Furthermore, it requires heating the tested die which can adversely affect the integrated circuitry formed on the die.

OBJECT OF THE INVENTION

In view of the foregoing there is a need in the art for improved methods for forming interconnects for semiconductor dice.

Accordingly it is an object of the present invention to provide an improved method for fabricating an interconnect for establishing a temporary electrical connection to contact locations on an unpackaged semiconductor dice.

It is a further object of the present invention to provide an improved method for fabricating interconnects having an improved contact structure adapted to penetrate a contact location on an unpackaged semiconductor die to a limited penetration depth.

It is yet another object of the present invention to provide an improved method for fabricating interconnects having a contact structure coated with a metal silicide conductive layer.

It is yet another object of the present invention to provide an improved method for fabricating interconnects having a contact structure coated with a conductive metal or bi-metal stack.

Other objects, advantages and capabilities of the present invention will become more apparent as the description proceeds.

SUMMARY OF THE INVENTION

In accordance with the present invention, an improved method for fabricating an interconnect for establishing a temporary electrical connection with an unpackaged semiconductor die is provided. The interconnect includes a substrate formed of a material such as silicon, which has a coefficient of thermal expansion that closely matches that of a semiconductor die. In addition, the interconnect includes raised contact members formed in a pattern that matches the size and spacing of contact locations on the die. In an illustrative embodiment the raised contact members are generally pyramidal in shape with sloped sidewalls and are formed using an anisotropic etch process.

Each raised contact member includes one or more penetrating projections adapted to penetrate the contact locations on the die and to pierce any residual insulating material to establish an ohmic connection. The projections are formed in a size and shape that permits penetration of the contact location of the die but to a limited penetration depth. For a contact location such as a bond pad, the projections are formed with a height that is less than the thickness of the bond pad (e.g., ¼ to ½) to prevent significant damage to the bond pad.

The raised contact members and projections are covered with a conductive layer. In an illustrative embodiment the conductive layer is formed as a metal silicide. The conductive layer can also be formed as a conductive metal or as a bi-metal stack. Conductive traces or runners are formed in electrical contact with the conductive layer to establish an electrical pathway to and from external circuitry (e.g., testing circuitry). The conductive traces completely surround or enclose the base of the contact members to ensure an efficient electrical connection between the traces and the conductive layer.

Preferably a large number of interconnects are formed on a single substrate or wafer using fabrication techniques used in semiconductor manufacture. The substrate can then be diced (e.g., saw cut) to singulate the interconnects.

For forming an interconnect having raised contact members with a metal silicide conductive layer, the method includes the steps of: providing a substrate; forming raised contact members on the substrate in a pattern that corresponds to a pattern of contact locations on a die, each raised contact member including at least one projection adapted to penetrate a contact location on the die to a limited penetration depth; forming a first insulating layer over the raised contact members and substrate; forming a silicon containing layer on the insulating layer; forming a second insulating layer on the silicon containing layer; etching away the second insulating layer on the raised contact members but not on the substrate; depositing a metal layer on the silicon containing layer; forming a metal silicide by reaction of the metal layer and silicon containing layer; removing the unreacted metal and the silicon containing layer; and then forming conductive traces in contact with the metal silicide layer.

BRIEF DESCRIPTION OF THE DRAWINGS

FIG. 1A shows a silicon substrate for the interconnect and a mask layer formed on the substrate;

FIG. 1E-1 to 1E-4 show various alternate embodiment projections;

FIG. 1A-1 shows the removal of the metal layer for the conductive traces on the raised contact structure;

FIG. 1A-2 shows the removal of the layer of photoresist and the completed contact structure and conductive traces;

FIG. 2 is a plan view of an interconnect formed in accordance with the invention;

FIG. 3 is a cross sectional view illustrating the contact structure of an interconnect formed in accordance with the invention electrically engaging a contact location on semiconductor die.

DETAILED DESCRIPTION OF THE INVENTION

Figure 1A:
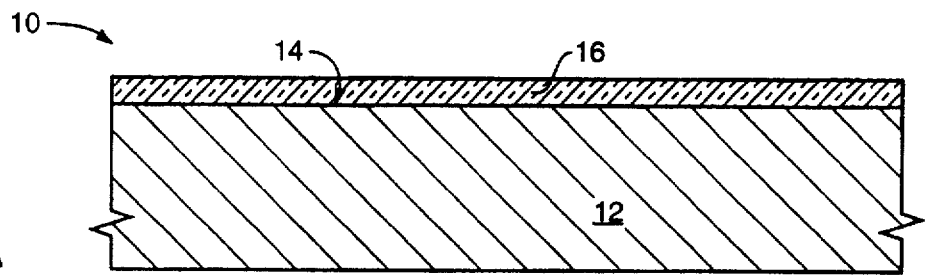
FIGS. 1A–1A-2 are schematic cross sectional views illustrating process steps in forming an interconnect in accordance with the method of the invention with a metal silicide conductive layer.

Referring now to FIG. 1A, a process for forming an interconnect 10 for establishing an electrical connection with contact locations on an unpackaged semiconductor die is shown. The interconnect 10 includes a substrate 12 formed of a material having a coefficient of thermal expansion (CTE) that closely matches the CTE of a silicon die. Suitable materials for the substrate include monocrystalline silicon, silicon-on-glass, silicon-on-sapphire, germanium, or ceramic.

The substrate 12 includes a planar outer surface 14. A mask layer 16 is formed on the outer surface 14 of the substrate 12. A typical thickness for the mask layer 16 is about 500 Å to 3000 Å. The mask layer 16 can be formed of a material, such as silicon nitride ($Si_3N_4$), using a suitable deposition process such as CVD.

Figure 1B:
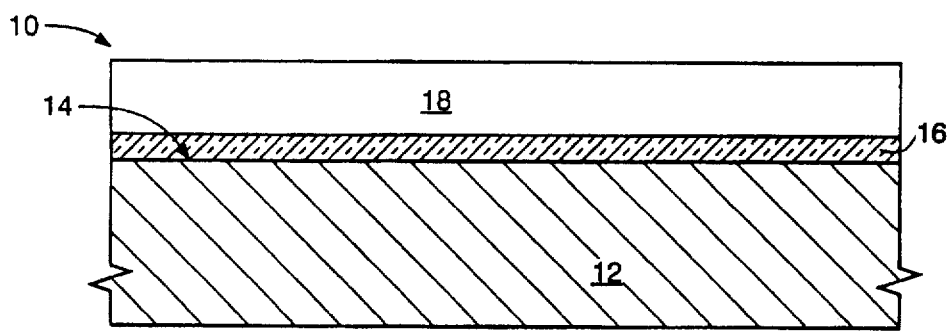
FIG. 1B shows a layer of photoresist deposited on the mask layer.

Next as shown in FIG. 1B, a layer of photoresist 18 is formed on the mask layer 16. The layer of photoresist 18 can be deposited using a spin-on process and then soft baked to drive out solvents. A typical thickness for the layer of photoresist is about 10,000 Å to 15,000 Å. Following the softbake, the layer of photoresist 18 is aligned with a mask and exposed using collimated UV light.

Figure 1C:
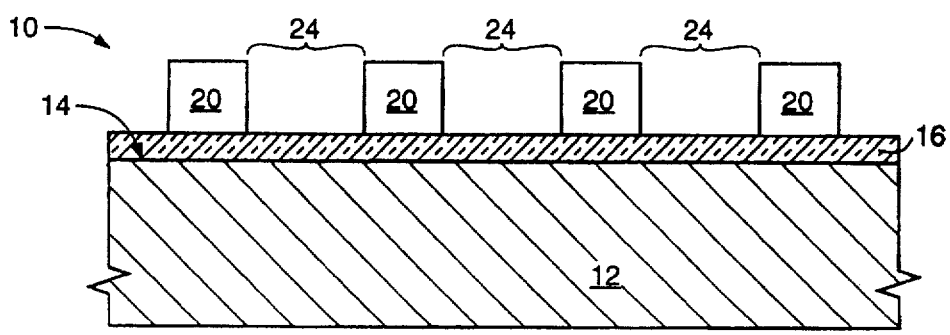
FIG. 1C shows the layer of photoresist after patterning and etching.

Next, as shown in FIG. 1C, the layer of photoresist 18 is developed to form a photoresist mask 20. For a positive resist, the development results in the dissolution of the exposed photoresist but does not affect the unexposed regions. For a negative resist, the development results in the dissolution of the unexposed resist.

Figure 1D:
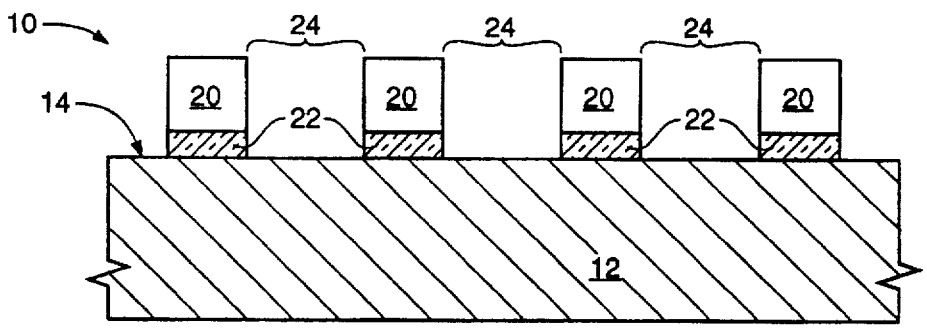
FIG. 1D shows the mask layer after etching using the patterned layer formed with the photoresist.

Next, as shown in FIG. 1D, the mask layer 16 is etched selective to the substrate 12 to form a hard mask that includes masking blocks 22 and openings 24 therebetween. Depending on the materials used for the mask layer 16, this etch step may be performed using a wet or dry etch. As an example, a mask layer 16 formed of silicon nitride may be etched with a pattern of openings using hot (e.g., 180° C.) phosphoric acid.

The photoresist mask 20 is removed using a suitable chemical solvent. For a positive resist a solvent such as acetone, methylethylketone or 1-methylethylketone can be used. For a negative resist a solution of concentrated $H_2SO_4$ and $H_2O_2$ at about 150° C. can be used. Such an etch is referred to in the art as a "piranha" etch.

Viewed from above the masking blocks 22 are elongated rectangular blocks formed in a parallel spaced pattern. The peripheral dimensions of the pattern of masking blocks 22 are selected to fall within the peripheral area of a contact location on a semiconductor die. As an example, the contact location on the die can be a polygonal shaped bond pad (e.g., rectangular or triangular shaped pad) that is about 50–100μm on a side. However, as will be more fully explained, such a parallel spaced pattern of masking blocks 22 is merely exemplary and other patterns or configurations are possible.

Figure 1E:
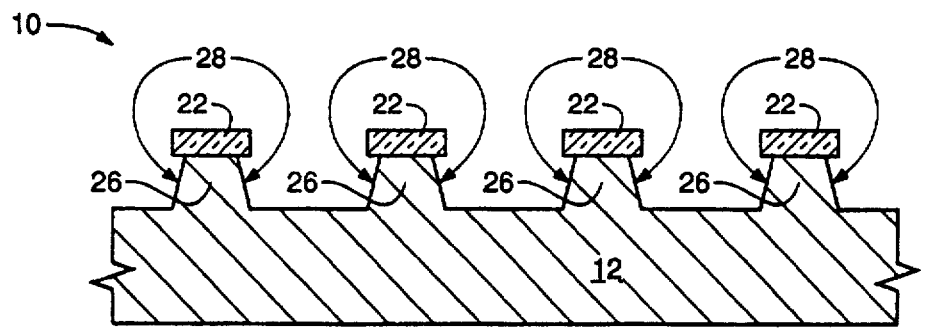
FIG. 1E shows the substrate after etching using the mask layer to form projections.

Next, as shown in FIG. 1E, penetrating projections 26 are formed on the substrate 12 by etching the exposed substrate 12 between the masking blocks 22. With etching, a wet or dry isotropic, or anisotropic, etch process is used to form the projections 26 as the material under the masking blocks 22 is undercut by the etchant reacting with the substrate 12. In other words, the exposed substrate 12 between the masking blocks 22 etches faster than the covered substrate 12 under the blocks 22.

For an anisotropic etch, in which the etch rate is different in different directions, an etchant solution containing a mixture of KOH and $H_2O$ can be utilized. This results in the projections 26 having sidewalls 28 that are sloped at an angle of approximately 54° with the horizontal. The slope of the sidewalls 28 is a function of the different etch rates of monocrystalline silicon along the different crystalline orientations. The surface of the substrate 12 represents the (100) planes of the silicon which etches faster than the sloped sidewalls 28 that represent the (111) plane.

Figures 1, 1E:
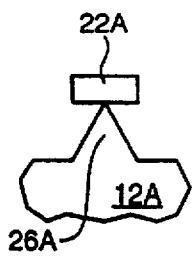
Figures 1, 1E, 2:
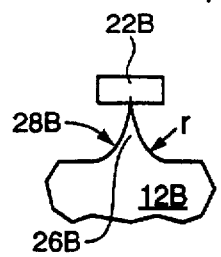
Figures 1, 1E, 2, 3:
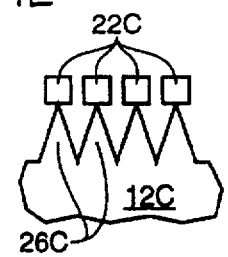
Figures 1, 1E, 2, 3, 4:
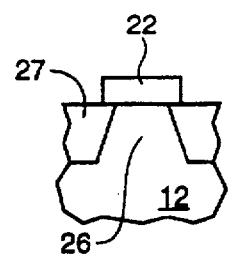
Figure 1F:
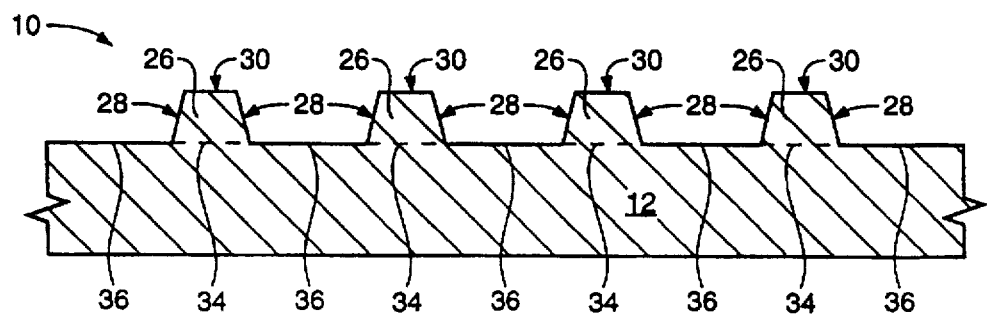
FIG. 1F shows the substrate and projections after stripping of the mask layer.

In addition to sloped sidewalls 28, the projections 26 include a flat tip portion 30 (FIG. 1F). The width of the tip portion 30 is determined by the width of the masking blocks 22 and by the parameters of the etch process. As shown in FIG. 1E-1, the width of the masking blocks 22A and etch parameters can also be controlled to form projections 26A having a pointed tip.

As shown in FIG. 1E-2, an isotropic etch can be used to form projections 26B having radiused sidewalls 28B. For an isotropic etch in which the etch rate is the same in all directions, an etchant solution containing a mixture of HF, $HNO_3$ and $H_2O$ can be utilized. This results in projections 26B having a pointed tip and a rounded sidewall contour. In this embodiment the sidewalls 28B of the projections 26B are undercut below the masking blocks 22B with a radius "r". The value of the radius "r" is controlled by the etch parameters (i.e., time, temperature, concentration of etchant) and by the width of the masking blocks 22B.

FIG. 1E-3 illustrates another embodiment wherein the projections 26C are formed in a saw tooth array with no spaces between the base portions. In this embodiment an anisotropic etch is used and the process parameters, including the etch time and width of the masking blocks 22C are controlled to provide a desired height and tip to tip spacing.

Alternately, in place of an isotropic or anisotropic etch process, the projections can be formed using an oxidizing process. This is shown in FIG. 1E-4. With an oxidizing process the substrate 12 may be subjected to an oxidizing atmosphere to oxidize exposed portions of the substrate 12 not covered by the masking blocks 22. As an example, the oxidizing atmosphere may comprise steam and $O_2$ at an elevated temperature (e.g., 950° C.). The oxidizing atmosphere oxidizes the exposed portions of the substrate 12 and forms an oxide layer 27 (e.g., silicon dioxide). When the oxide layer 27 is stripped the resultant structure includes projections 26. With an oxidizing process, the grown oxide layer can be stripped using a suitable wet etchant such as HF.

The projections 26 can also be formed by a deposition process out of a different material than the substrate 12. As an example, a CVD process can be used to form the projections out of a deposited metal.

Following formation of the projections 26, and as shown in FIG. 1F, the masking blocks 22 are stripped. Masking blocks 22 formed of silicon nitride can be stripped using a wet etchant such as $H_3PO_4$ that is selective to the substrate 12. The projections 26 project from a surface 32 of the substrate 12 and include flat tips 30 and bases 34. The bases 34 of adjacent projections 26 are spaced from one another a distance sufficient to define a penetration stop plane 36 there between. The function of the penetration stop plane 36 will be apparent from the continuing discussion.

Example spacing between bases 34 would be about 10μm, while an example length of the projections 26 (i.e., dimension perpendicular to the cross section shown) would be from 3 to 10μm. The height of each projection 26 is preferably about 1/10 to 1/2 the thickness of a bond pad on a semiconductor die. The projection 26 will therefore not completely penetrate the full thickness of the bond pad. In addition, this height is selected to allow good electrical contact but at the same time to minimally damage the bond pad. As an example, the height of each projection 26 measured from the top of the substrate 12 to the tip of the projection 26 will be on the order of 2000–5000 Å. This compares to the thickness of a bond pad that is typically on the order of 6000 to 10,000 Å.

Figure 1G:
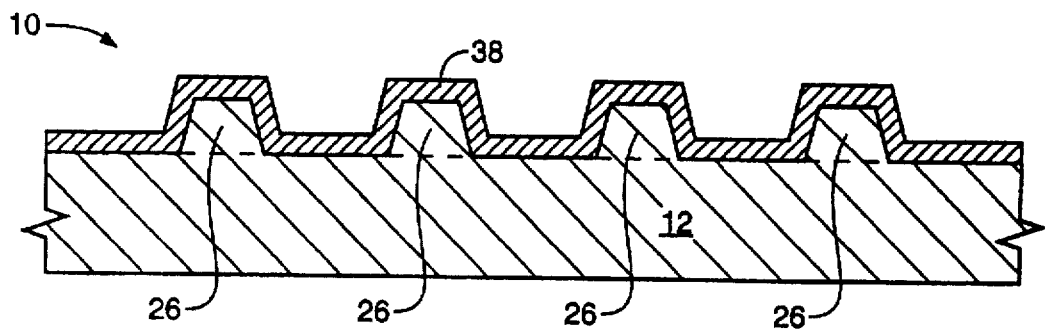
FIG. 1G shows another mask layer formed on the etched substrate.

Following the formation of the projections 26 and as shown in FIG. 1G, a mask layer 38 is formed on the substrate 12 and projections 26. A typical thickness for the mask layer 38 is about 500 Å to 3000 Å. The mask layer 38 can be formed of a material, such as silicon nitride ($Si_3N_4$), using a suitable deposition process such as CVD.

Figure 1H:
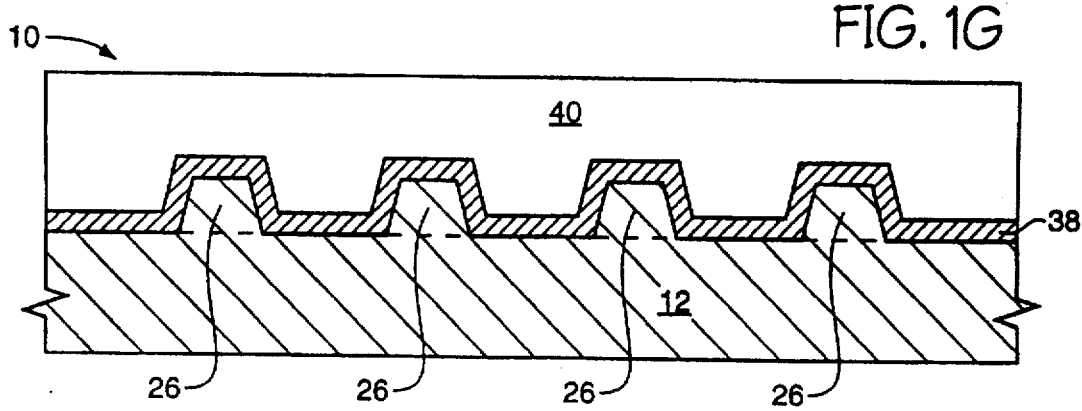
FIG. 1H shows a layer of photoresist formed on the mask layer.

Next, as shown in FIG. 1H, a layer of photoresist 40 is formed on the mask layer 38. The layer of photoresist 40 is baked, aligned and developed as previously described to form a photomask 42 (FIG. 1I).

Figure 1I:
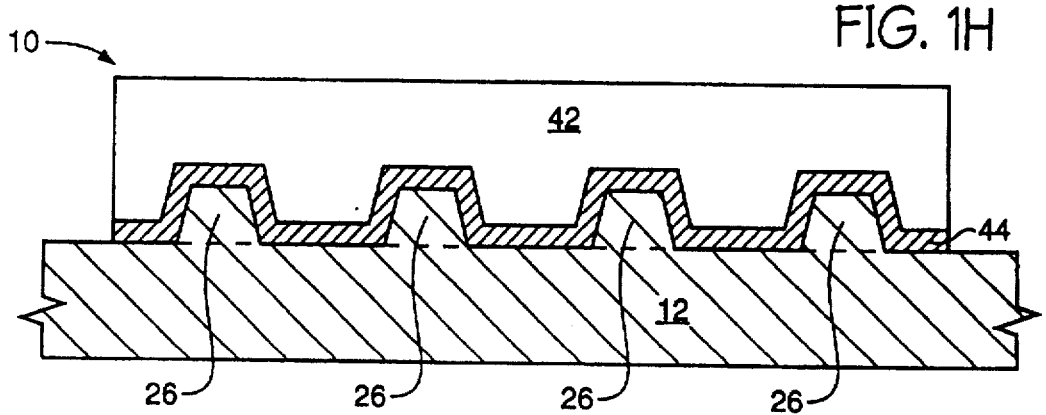
FIG. 1I shows the layer of photoresist and the mask layer after patterning and etching.
Figure 1J:
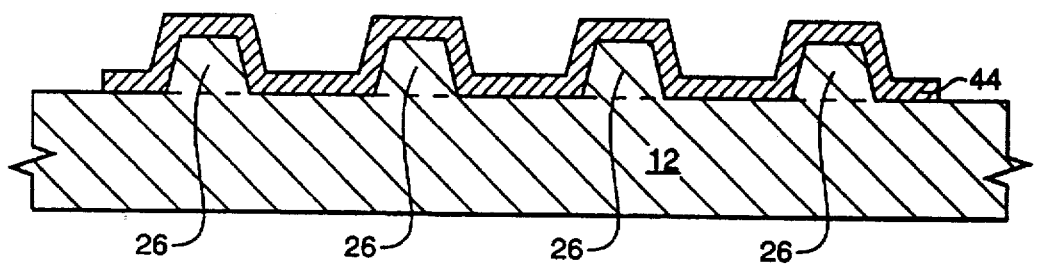
FIG. 1J shows the substrate and mask layer over the projections following removal of the layer of photoresist.

Next, as shown in FIGS. 1I and 1J, the mask layer 38 is etched and the photomask 42 is stripped to form a hard mask 44. The mask layer 44 is laid out to form contact members that correspond to the placement of contact locations (e.g., bond pads) on a semiconductor die. For a mask layer 38 formed of silicon nitride a dry etch process can be used to etch the mask layer 38 to form the hard mask 44. Suitable dry etchant species include a CL and $NF_3$ mixture. A wet etchant as previously described can also be utilized to remove the mask layer 44. The resist photomask 42 can be removed using a piranha etch as previously described.

Figure 1K:
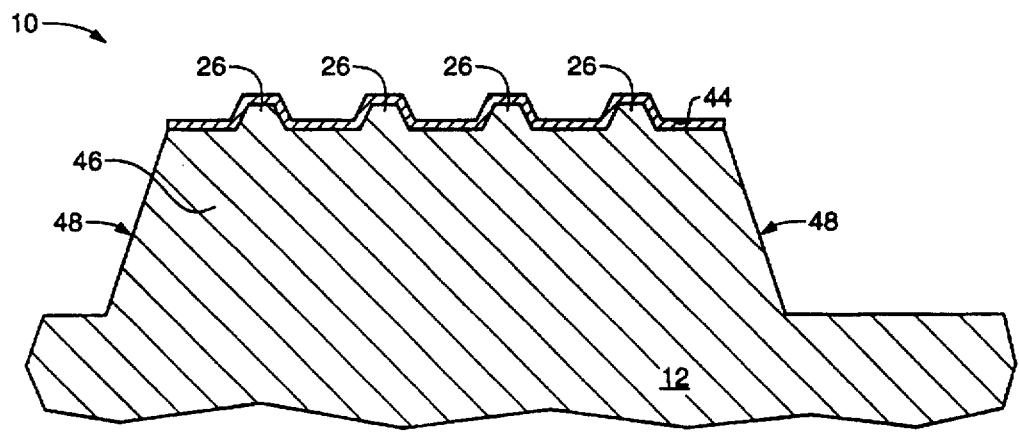
FIG. 1K shows the substrate etched using the mask layer to form a raised contact structure.

Next, as shown in FIG. 1K, the substrate 12 is etched around the hard mask 44 to form raised contact members 46. Typical etching techniques comprise wet anisotropic etching with a mixture of $KOH:H_2O$. This type of etching is also known in the art as bulk micro-machining. With an anisotropic etch the sidewalls 48 of the contact member 46 will be sloped at an angle of about 54° with the horizontal. This forms a the contact member 46, which in cross section is generally pyramidally shaped with a truncated tip.

The contact members 46 are sized and shaped to contact a bond pad of a semiconductor die. Each contact member 46 viewed from above has a generally square rectangular peripheral configuration and is dimensioned to fall within the perimeter of a bond pad. The contact members 46 can also be formed in other peripheral configurations such as triangles, polygons or circles. The height of each contact member 46 will be on the order of 50–100μm and the width on each side about 40–80 μm. The spacing of adjacent contact members 46 matches the spacing of adjacent bond pads on a semiconductor die (e.g., 50 to 100μm).

Figure 1L:
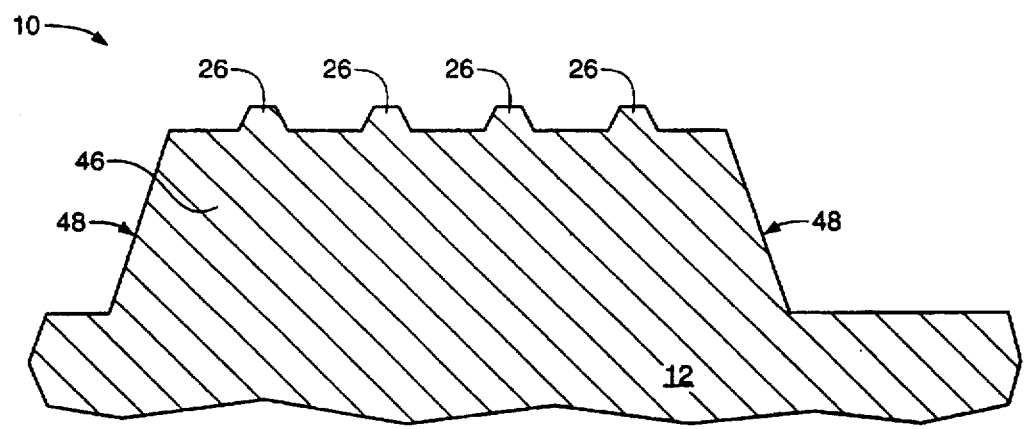
FIG. 1L shows the raised contact structure following removal of the mask layer.

Next, as shown in FIG. 1L, the hard mask 44 is removed using a wet etch. For a hard mask 44 formed of silicon nitride an etchant, such as $H_3PO_4$, that is selective to the substrate 12 can be used.

Figure 1M:
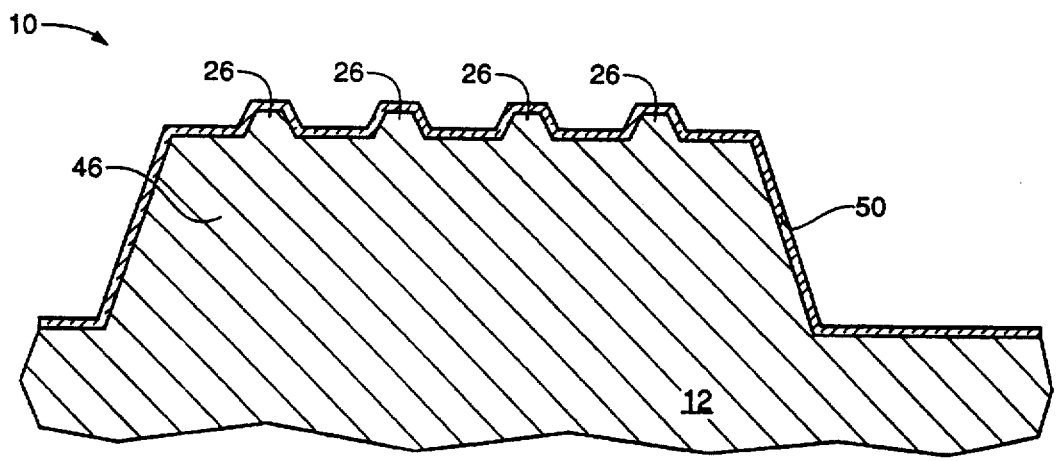
FIG. 1M shows the formation of an insulating layer on the raised contact structure and substrate.

Next, as shown in FIG. 1M, an insulating layer 50 is formed on the substrate 12 and over the projections 26 and sidewalls 48 thereof. The insulating layer 68 is formed by oxidation of the substrate 12 and may be accomplished by exposing the substrate 12 and to an oxidizing atmosphere in a reaction chamber. Silicon dioxide can also be deposited using CVD. Another commonly used insulator suitable for this purpose is $Si_3N_4$. TEOS (tetraethylorthosilane) can be injected into the reaction chamber to grow silicon dioxide ($SiO_2$) at a temperature of about 400° C. A representative thickness for the insulating layer 50 is from about 500 Å to 6000 Å.

Figure 1N:
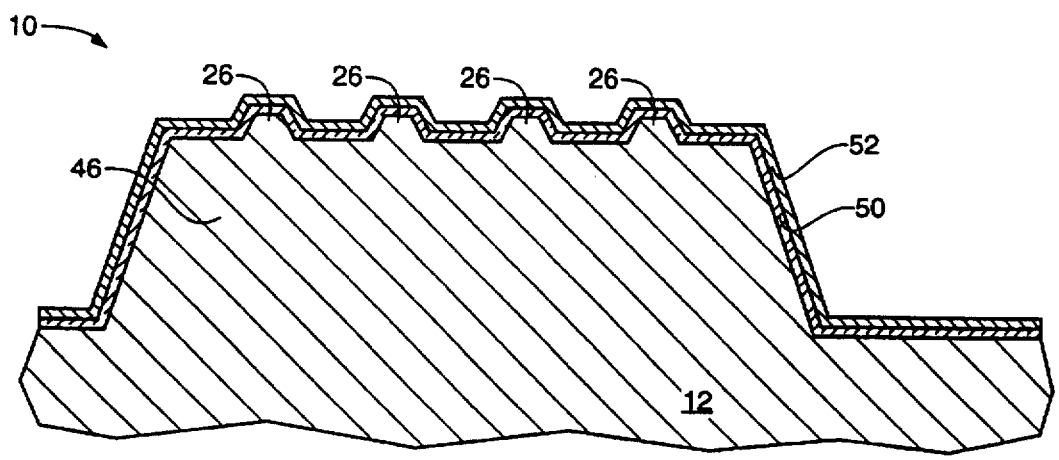
FIG. 1N shows the formation of a silicon containing layer on the insulating layer.

Next, as shown in FIG. 1N, a silicon containing layer 52 (e.g., undoped polysilicon, doped polysilicon, undoped amorphous silicon, doped amorphous silicon) is formed on the insulating layer 50. In the illustrative embodiment the silicon containing layer 52 is undoped polysilicon conformally deposited on the insulating layer 50 by CVD, sputtering or evaporation. A representative thickness for the silicon containing layer 52 is about from about 500 Å to 3000 Å.

Figure 1O:
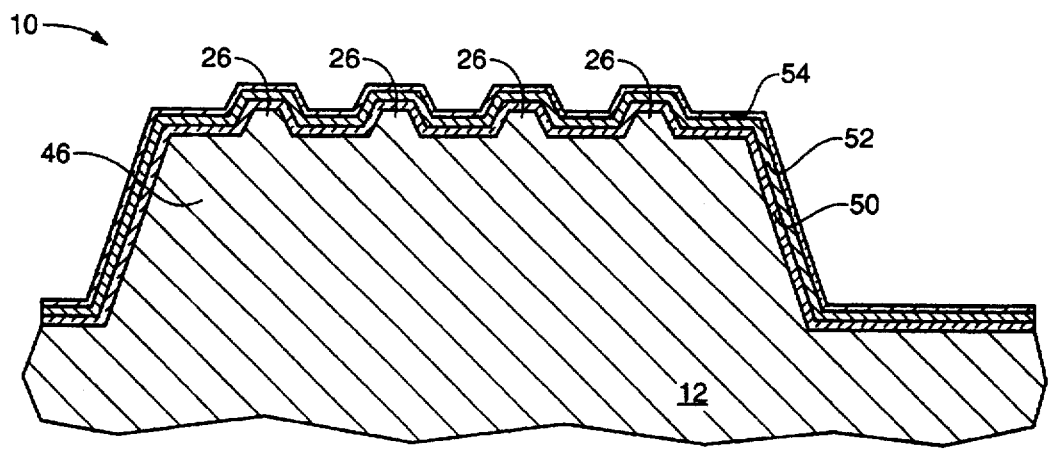
FIG. 1O shows the formation of a thin insulating layer on the raised contact and silicon containing layer.

Next, as shown in FIG. 1O, a thin insulating layer 54 is formed on the silicon containing layer 52. The purpose of the thin insulating layer 54 is used as a hard mask for the salacide process during a subsequent salicide process. The thin insulating layer 54 is preferably silicon dioxide formed using TEOS as previously described. A representative thickness for the thin insulating layer 54 is about 100 Å to 500 Å.

Figure 1P:
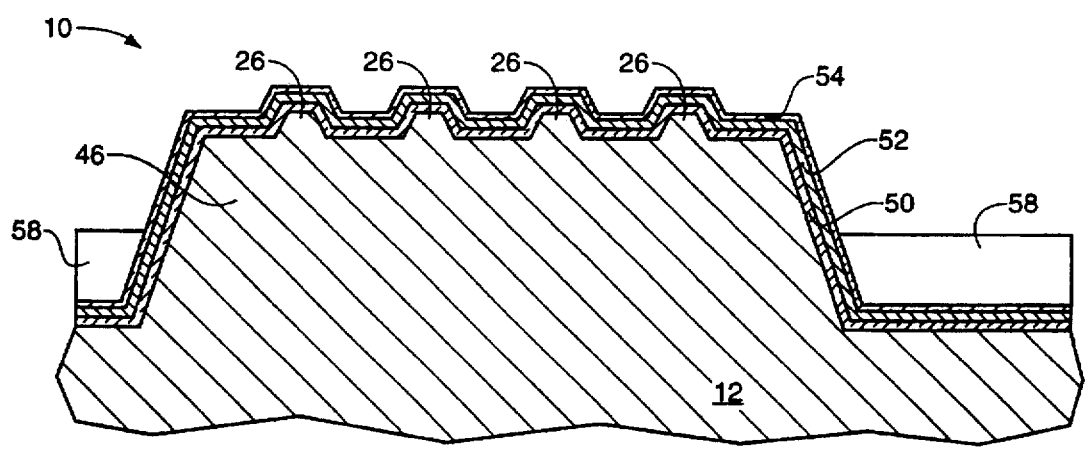
FIG. 1P shows the formation of layer of photoresist on the substrate.

Next, as shown in FIG. 1P, a layer of photoresist 58 is deposited over the substrate 12 using a spin on or other suitable process.

Figure 1Q:
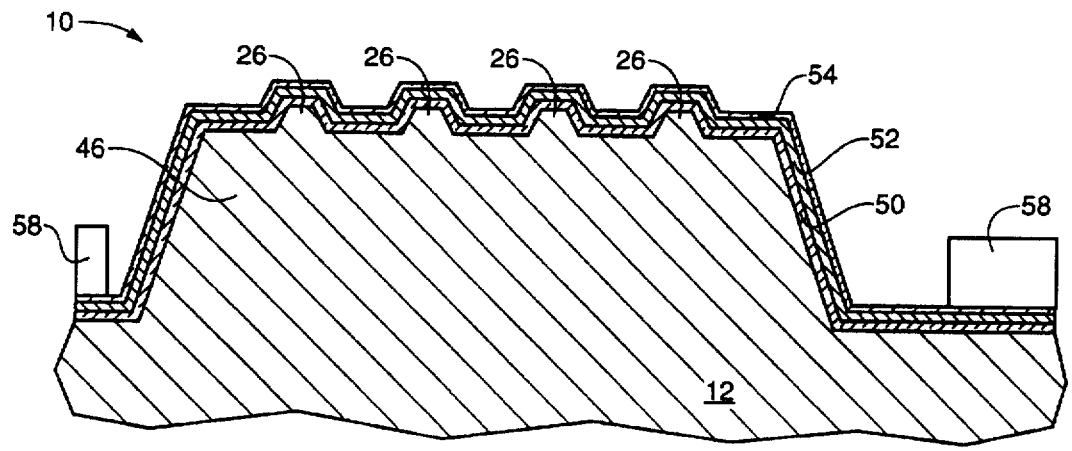
FIG. 1Q shows the layer of photoresist after patterning and etching.

Next, as shown in FIG. 1Q, the layer of photoresist 58 is developed to form a photomask. The photomask is developed such that the contact members 46 remain exposed. This is relatively easy to accomplish because the photoresist 58 will tend to puddle on the lower portions of the structure, such as surface of the substrate 12, leaving the projecting contact members 46 exposed.

Figure 1R:
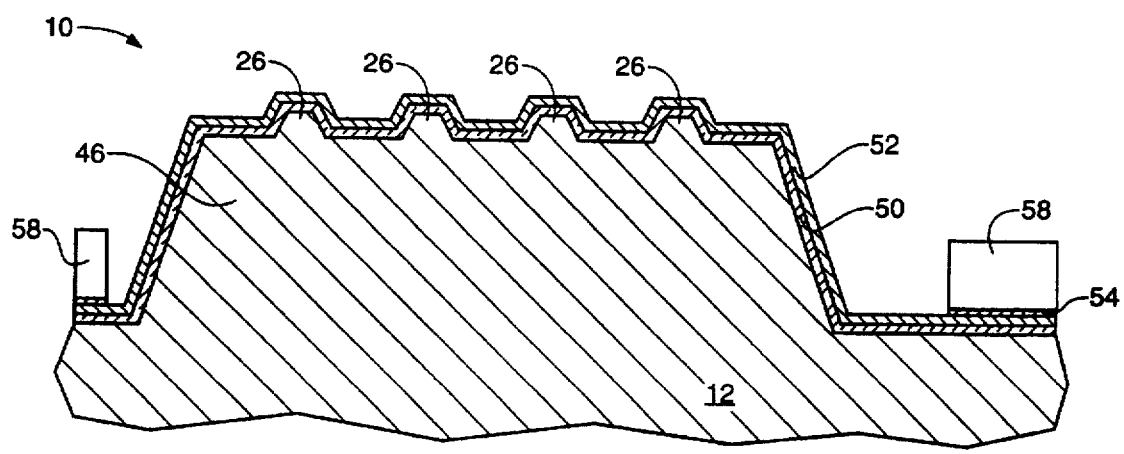
FIG. 1R shows the raised contact after etching of the silicon containing layer.

Next, as shown in FIG. 1R, the thin insulating layer 54 is removed from the contact members 46 by etching. For a thin insulating layer 54 formed of silicon dioxide, dry etching can be performed using a chlorine or fluorine etching species such as $CF_4$, $CHF_3$, $C_2F_6$ or $C_3F_8$. Parameters of the etch process are controlled to end point the etch within the polysilicon containing layer 52 so that it is substantially unaffected.

Figure 1S:
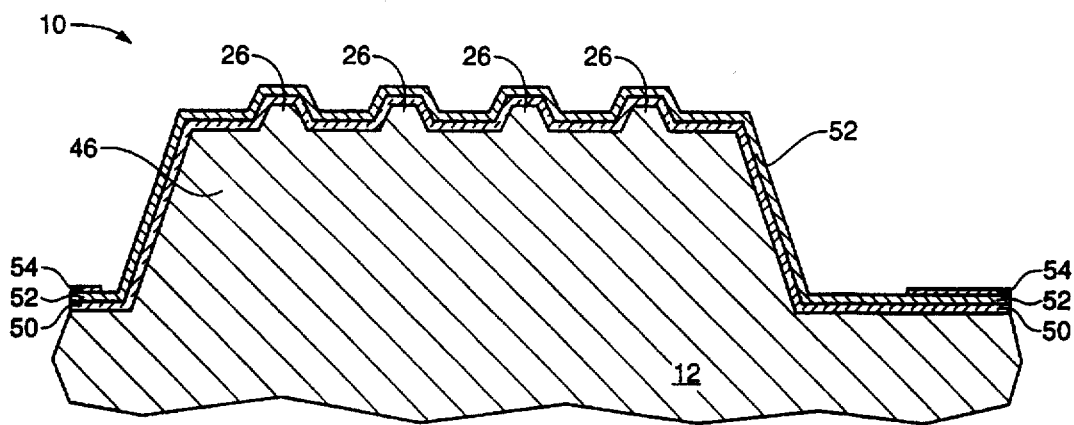
FIG. 1S shows the raised contact and substrate after removal of the layer of photoresist.

Next, as shown in FIG. 1S, the photoresist 58 is stripped. Stripping of the photoresist 58 can be with a piranha etch as previously described. Note that the thin oxide layer 54 still covers the silicon containing layer 52 for protection during a subsequent salicide process.

Figure 1T:
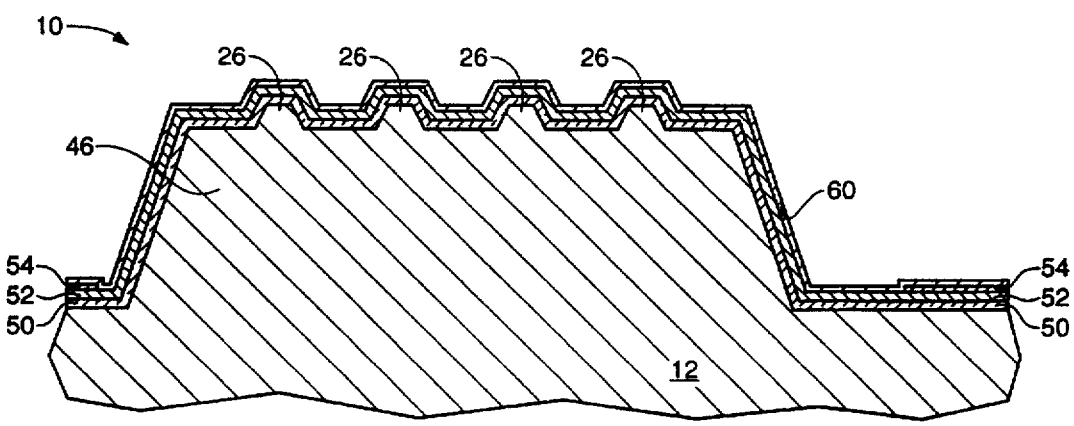
FIG. 1T shows the deposition of a metal layer over the silicon containing layer on the raised contact and over the thin insulating layer on the substrate.

Next, as shown in FIG. 1T, a metal layer 60 is blanket deposited over the substrate 12 and contact members 46. The metal layer 60 is deposited using a process such as CVD to a thickness of about 600 Å–1200 Å. The metal layer 60 is formed of a metal that will react with the silicon containing layer 52 to form a metal silicide in area where the thin oxide layer 54 was removed. Suitable metals include the refractory metals, such as titanium (Ti), tungsten (W), tantalum (Ta), platinum (Pt) and molybdenum (Mo). In general, silicides of these metals ($WSi_2$, $TaSi_2$, $MoSi_2$, $PtSi_2$ and $TiSi_2$) are formed by alloying with a silicon surface. Other suitable metals include cobalt (Co), nickel (Ni), molybdenum (Mo), copper (Cu), gold (Au) and iridium (Ir).

Figure 1U:
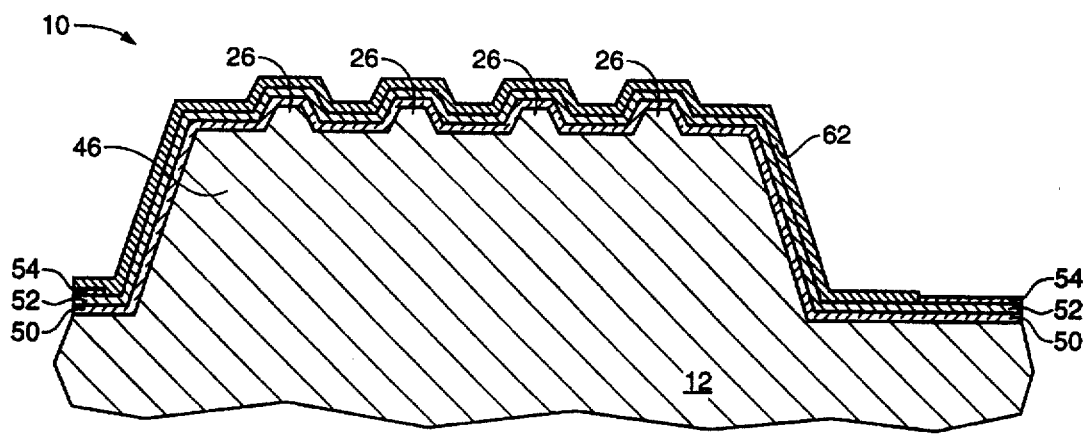
FIG. 1U shows the formation of a silicide layer by reaction of the metal layer and silicon containing layer on the raised contact structure.

Next, as shown in FIG. 1U, a sintering process is performed in which the metal layer 60 is reacted with the silicon containing layer 52 to form a silicide layer 62. This type of sintering process is also known in the art as silicide sintering. Such a sintering step can be performed by heating the silicon containing layer 52 and metal layer 54 to a temperature of about 650° to 820° C. for typical thicknesses in thousands of angstrom (e.g., 2000 Å–3000 Å). This sintering process can be performed in one single step or using multiple temperature steps. The silicide layer 62 forms at the interface of the metal layer 54 and the silicon containing layer 52.

Figure 1V:
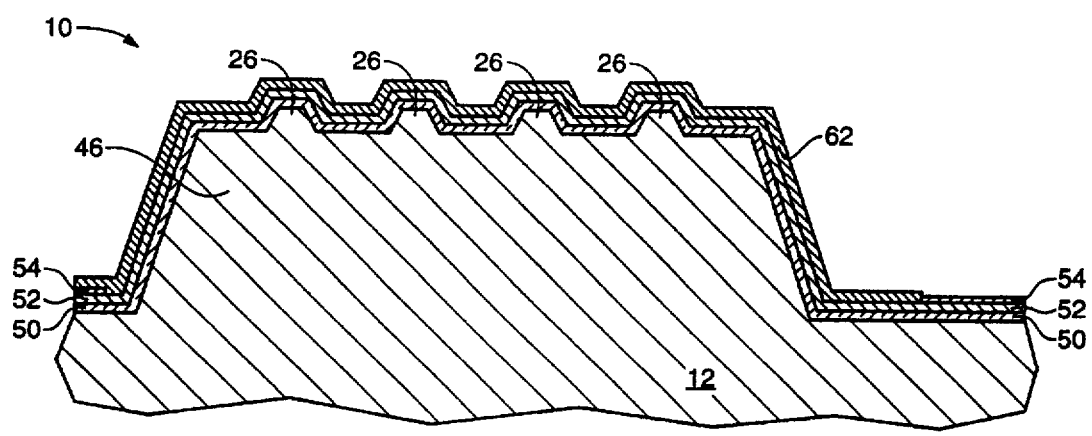
FIG. 1V shows the removal of the unreacted metal layer on the raised contact and on the remainder of the substrate.

Next, as shown in FIG. 1V, the unreacted portions of the metal layer 60 and the silicon containing layer 52 are removed while the silicide layer 62 is left intact. This process is known in the art as a salicide process. This can be done by etching the metal layer 60 and silicon containing layer 52 selective to the silicide layer 62. By way of example, for a $TiSi_2$ silicide layer 62, the unreacted titanium can be removed with a wet etchant such as a solution of ammonia and hydrogen peroxide, or an $H_2SO_4/H_2O_2$ mixture, that will attack a titanium metal layer 60 and not the silicide layer 62. Alternately, a dry etch process with an etchant species such as $Cl_2$ or $BCl_3$ can be used to etch the metal layer 60 selective to the silicide layer 62.

For etching the unreacted portion of the silicon containing layer 52 selective to the silicide layer 62, a wet etchant such as an $HF:HNO_3:H_2O$ acid mixture (typical ratios of 1:10:10) can be used to remove the unreacted silicon. A wet isotropic etchant can also be used for this purpose. Alternately the silicon containing layer 52 can be etched selective to the silicide layer 62 using a dry etch process and an etchant such as $NF_3$ at low pressures (typically 30 m torr). A portion of the silicon containing layer 52 (e.g., 200 Å) is left under the silicide layer 62 in order to insure adhesion of the silicide layer 62 with the substrate 12.

Following formation of the silicide layer 62, the resistivity of the silicide layer 62 may be lowered using an annealing process. This may be accomplished by heating the substrate 12 and silicide layer 62 to a temperature of between about 780° C. to 850° C. for several minutes.

Figure 1W:
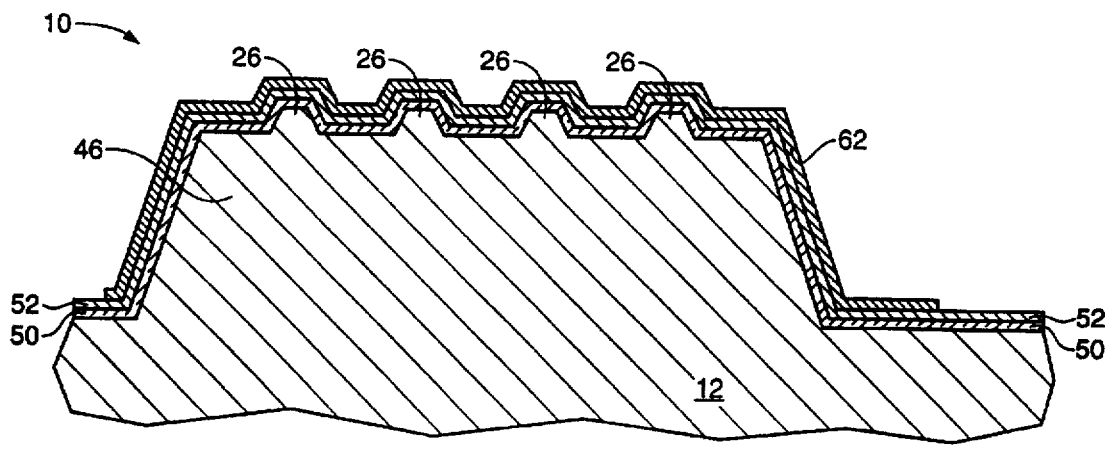
FIG. 1W shows the substrate after removal of the thin insulating layer.

Next, as shown in FIG. 1W, the thin insulating layer 50 is etched from the substrate 12. For a thin insulating layer 54 formed of silicon dioxide, dry etching can be performed using a chlorine or fluorine etching species such as $CHF_3$, $C_2F_6$ or $C_3F_8$.

Figure 1X:
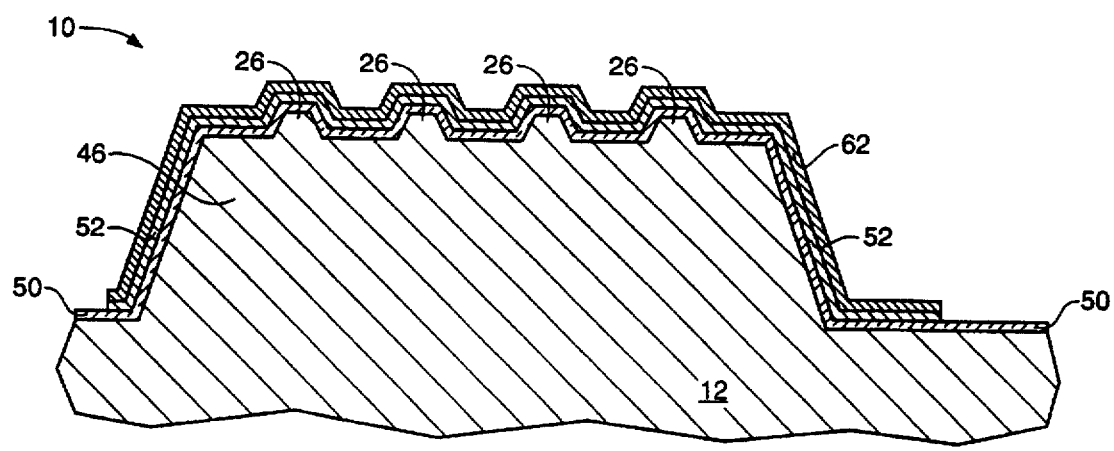
FIG. 1X shows the substrate after removal of the silicon containing layer.

Next, as shown in FIG. 1X, the silicon containing layer 52 (except subjacent to the silicide layer 62) is removed from the substrate 12. For a silicon containing layer 52 formed of polysilicon, etching can be with a solution of $HNO_3/HF$.

Figure 1Y:
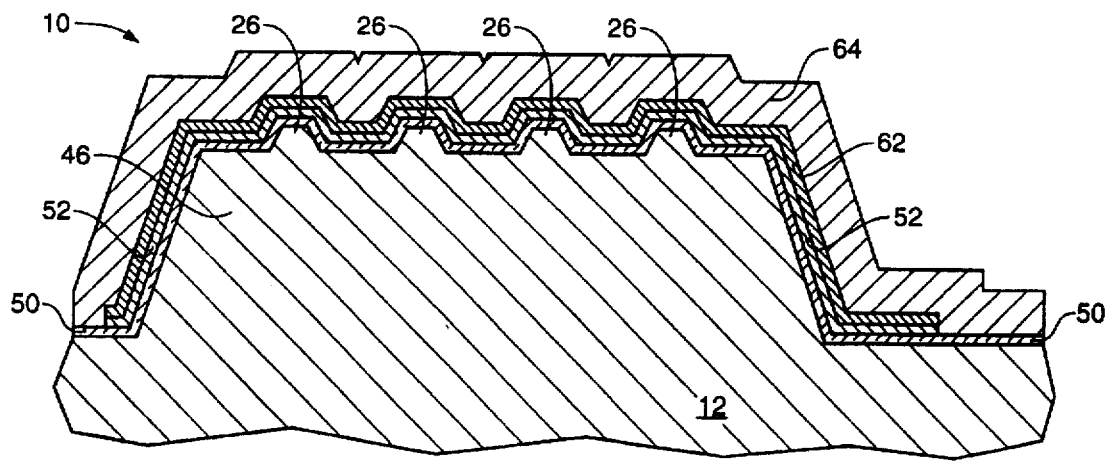
FIG. 1Y shows the blanket deposition of a layer of metal over the raised contact and substrate for forming conductive traces.

Next, as shown in FIG. 1Y, a conductive metal layer 64 is blanket deposited on the contact member 46 and substrate 12. The conductive metal layer 64 is formed of a highly conductive metal such as aluminum, copper or alloys thereof, or a refractory metal such as titanium, tungsten, tantalum and molybdenum or alloys of these metals. The conductive metal layer 64 can be blanket deposited by CVD or sputtering.

Figure 1Z:
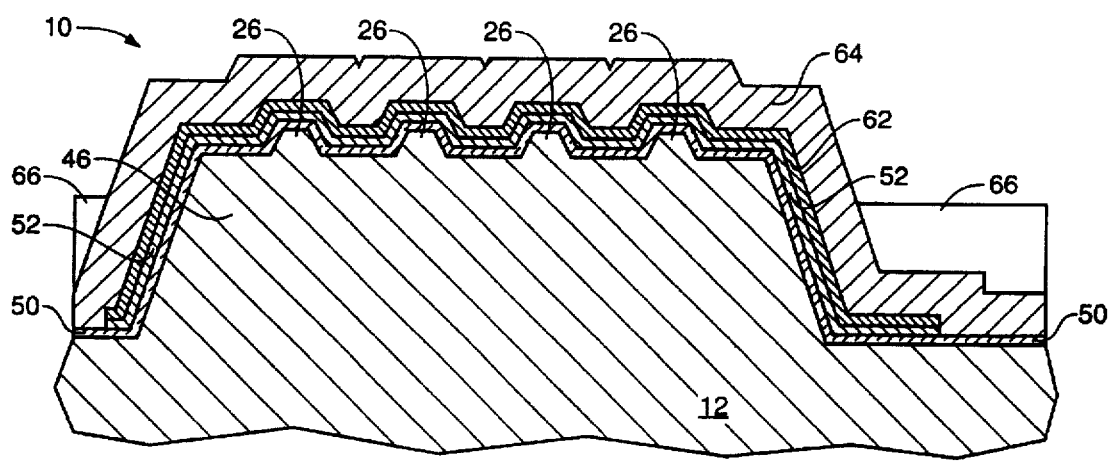
FIG. 1Z shows the formation of a layer of photoresist over the layer of metal.
Figures 1, 1A:
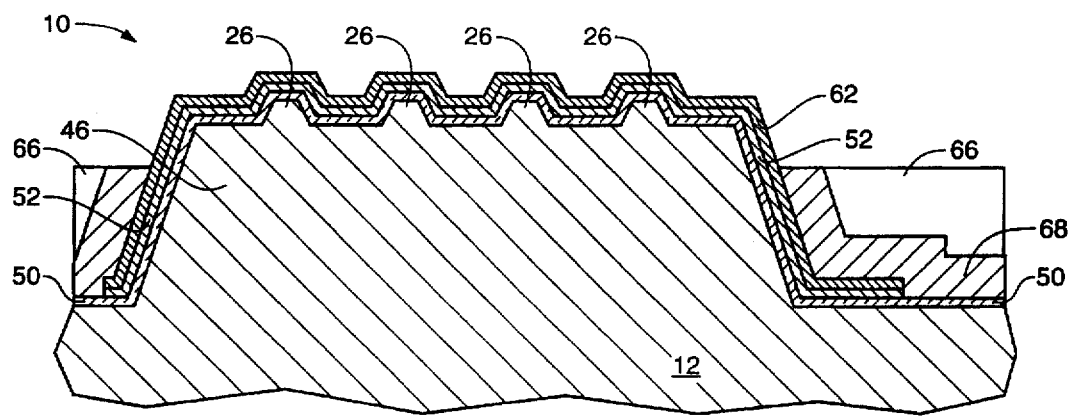
Figures 1, 1A, 2:
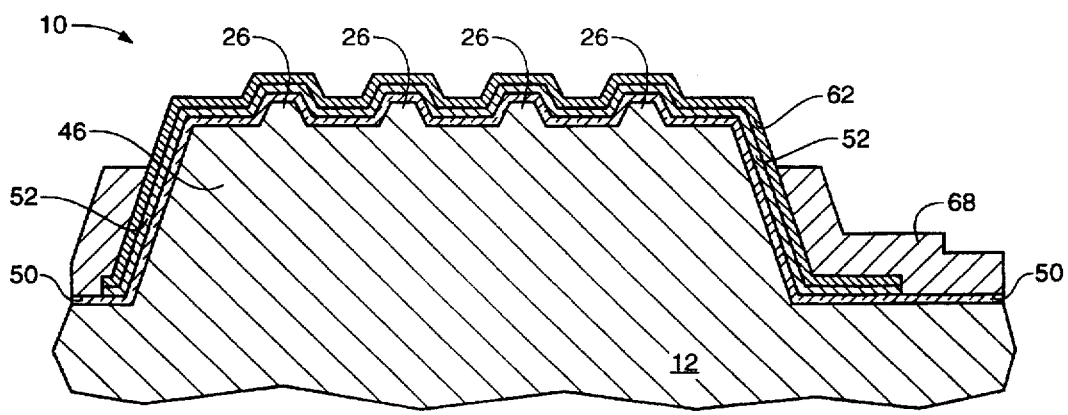
Figure 2:
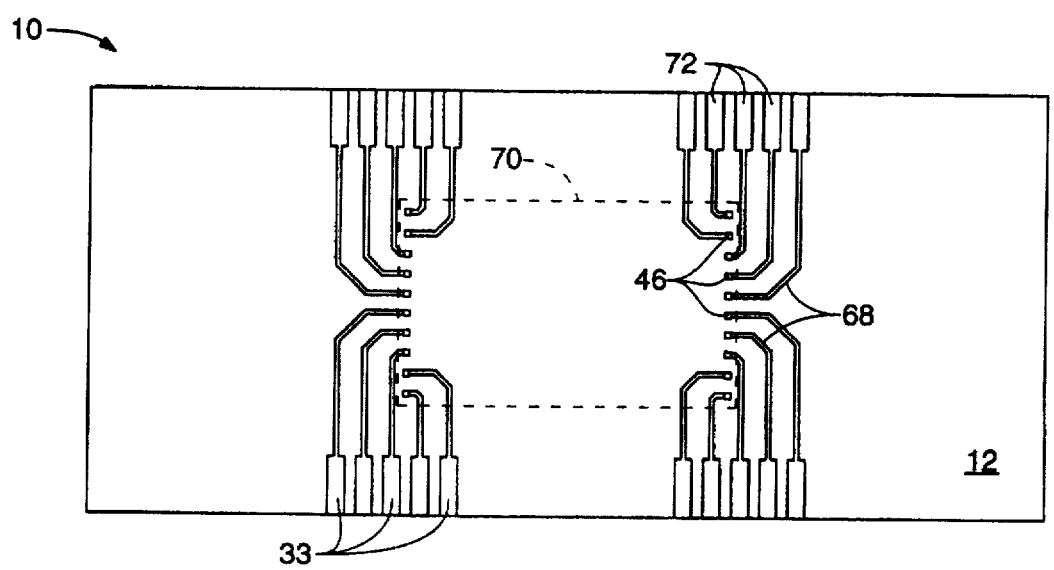
Figure 3:
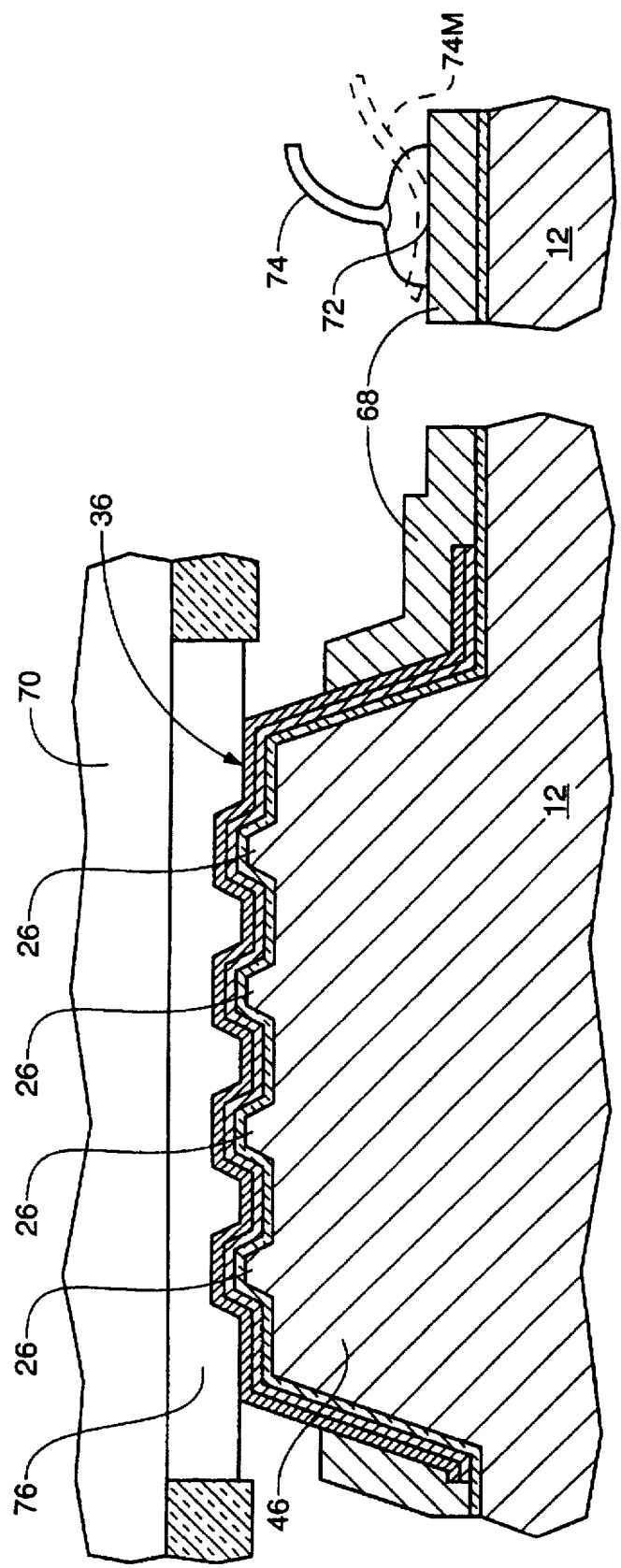

Next, as shown in FIG. 1Z, a layer of photoresist 66 is deposited on the conductive metal layer 64. The layer of photoresist 66 is then aligned with a mask pattern and developed. The mask pattern includes open areas over the raised contact members 46 and in areas of the substrate where metal is to be removed for forming conductive traces.

Next, as shown in FIG. 1A-1, the conductive metal layer 64 is etched to remove the conductive metal layer in the area over the tips of the raised contact members 46. At the same time a pattern of conductive traces 68 is etched from the conductive metal layer. The conductive metal layer 64 can be etched using a suitable wet etchant. As an example, for a conductive metal layer 64 formed of aluminum, a wet etchant such as $H_3PO_4$ can be used to etch the conductive traces 68 and the area over the raised contact members 46.

Next, as shown in FIG. 1A-2, the layer of photoresist 66 is stripped leaving behind the pattern of conductive traces 68. Each conductive trace 68 is in electrical communication with the silicide layer 62 that overlies its respective raised contact member 46. Note that the conductive trace 68 completely encompasses the base of the raised contact member 46. This insures a low resistance electrical connection between the silicide layer 62 on a contact member 46 and its associated conductive trace 68. In addition the silicide layer 62 and the conductive traces 68 are insulated from the substrate by the insulating layer 50.

FIG. 2 shows the completed interconnect 10 with a semiconductor die 70 superimposed thereon. Preferably a large number of interconnects 10 have been fabricated on a single wafer and then singulated using a diamond tipped saw. The completed interconnect is generally rectangular in shape and is about twice the size and surface area of the die 70. The raised contact members 46 are arranged in a pattern that matches the pattern of contact locations on the die 70. In addition, each contact member is in electrical communication with a conductive trace 68. Each conductive trace 68 extends to an edge of the interconnect 10 and terminates in a connection pad 72. The connection pads 72 are for connection to bond wires or mechanical connectors for establishing an electrical pathway to external circuitry (e.g., test circuitry). This electrical pathway allows signals to be transmitted from external test circuitry, through the conductive traces 68, through the silicide layer 62 for each contact member 46 and to a mating contact location on the semiconductor die 70.

Referring now to FIG. 3, a cross section of the interconnect 10 during testing of the semiconductor die 70 is shown. The semiconductor die 70 is an unpackaged die having a bond pad 76. The bond pad 76 connects electrically to integrated circuits formed in the die 70. For testing the die 70, the interconnect 10 and die 70 are mounted within a temporary carrier suitable for testing discrete unpackaged semiconductor die. By way of example, a temporary carrier is described in previously cited U.S. Pat. No. 5,302,891 entitled "Discrete Die Burn-In For Non-Packaged Die", which is incorporated herein by reference. Other suitable carriers are disclosed in related application Ser. No. 08/345, 064 filed Nov. 14, 1994 and entitled "Carrier For Testing An Unpackaged Semiconductor Die", which is also incorporated herein by reference. With such a carrier the interconnect 10 is used to establish a temporary electrical connection between the die 70 and external test circuitry. The interconnect 10 and die 70 are temporarily biased together by the carrier and are separated following the test procedure.

Initially, the interconnect 10 is mounted within the carrier and a wire 74 is wire bonded to a connection pad 72 for each conductive trace 68. (Alternately mechanical connectors 74M can be used.) This places the wire 74 in electrical communication with the conductive trace at one end. An opposite end of the wire 74 is placed in electrical communication with external connectors (not shown) located on the carrier. This can also be accomplished by wire bonding.

The external connectors on the carrier are connectable to external test circuitry. The test circuitry is adapted to generate test signals for testing the operability of the integrated circuits formed on the die 70. The carrier includes provision for aligning the die 70 and interconnect 10 and biasing the die 70 and interconnect 10 together.

The interconnect 10 and die 70 are biased together such that the projections 26 penetrate into the bond pad 76 on the die 70. The projections 26 completely penetrate any oxide layer covering the bond pad 76 to establish an ohmic connection. At the same time, a penetration depth of the projections 26 into the bond pad 76 is limited by the stop plane 36 formed by the top surface of the contact member 46.

The projections 26 are dimensioned to penetrate to a predetermined depth that is less than the thickness of the bond pad 76. Preferably the projections 26 have a height which is much less than the thickness of the bond pad (e.g., 1/10) to prevent excessive surface damage. If damage to the bond pad 76 is minimized during testing, the bond pad 76 will not require a subsequent reflow process.

FIGS. 4A-4F illustrate exemplary patterns for the projections 26 formed on the raised contact members 26. FIG.

Figure 4A:
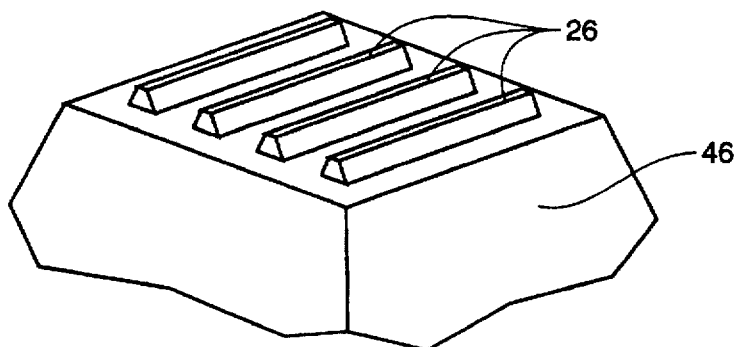
FIG. 4A is a perspective view of a raised contact formed in accordance with the invention with a parallel spaced array of penetrating projections.
Figure 4B:
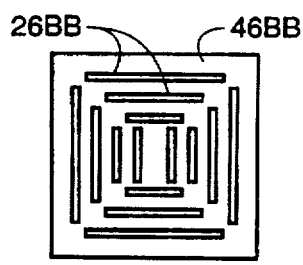
FIGS. 4B–4F are plan views illustrating various pattern arrangements for the projections.
Figure 4C:
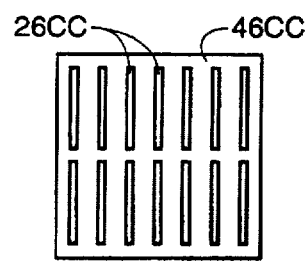
Figure 4D:
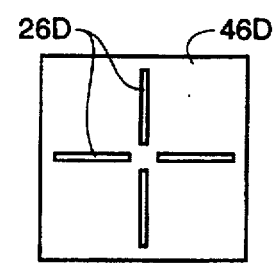
Figure 4E:
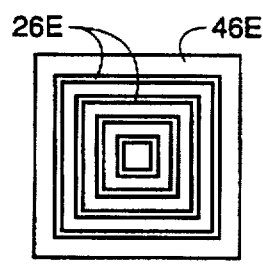
Figure 4F:
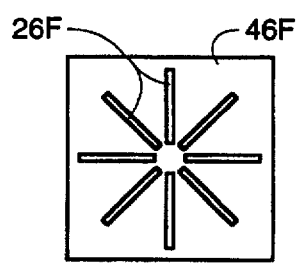

4A shows the pattern of projections 46 formed by the process of FIGS. 1A–1BB. In FIG. 4A the projections 26 are formed on the contact member 46 in a parallel spaced array. In FIG. 4B the projections 26BB are formed on the contact member 46B in pattern of discontinuous nested squares. In FIG. 4C the projections 26CC are formed on the contact member 46C in two rows. In FIG. 4D the projections 26D are formed on the contact member 46D in a cross pattern. In FIG. 4E the projections 26E are formed on the contact member 46E as enclosed nested squares. In FIG. 4F the projections 26F are formed on the contact member 46F in a spoke-like pattern.

Figure 5A:
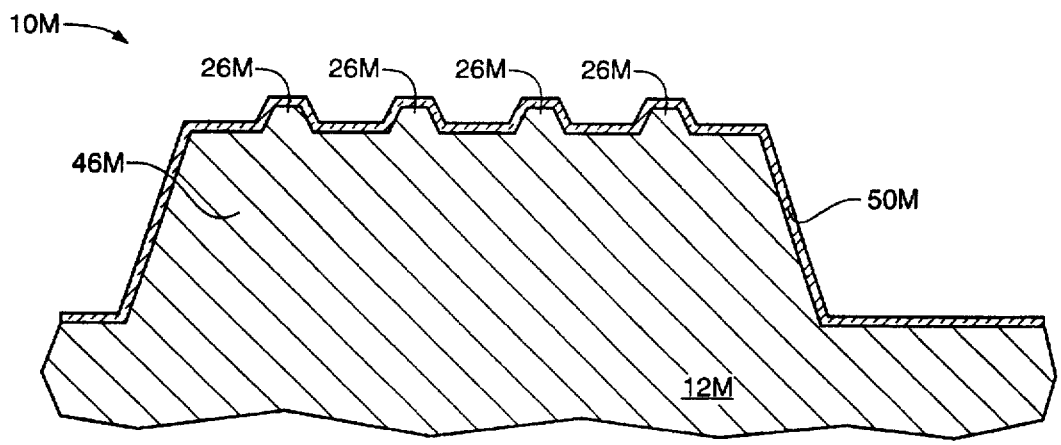
FIG. 5A is a cross sectional view equivalent to FIG. 1M and illustrating the formation of an insulating layer prior to deposition of a metal conductive layer.
Figure 5B:
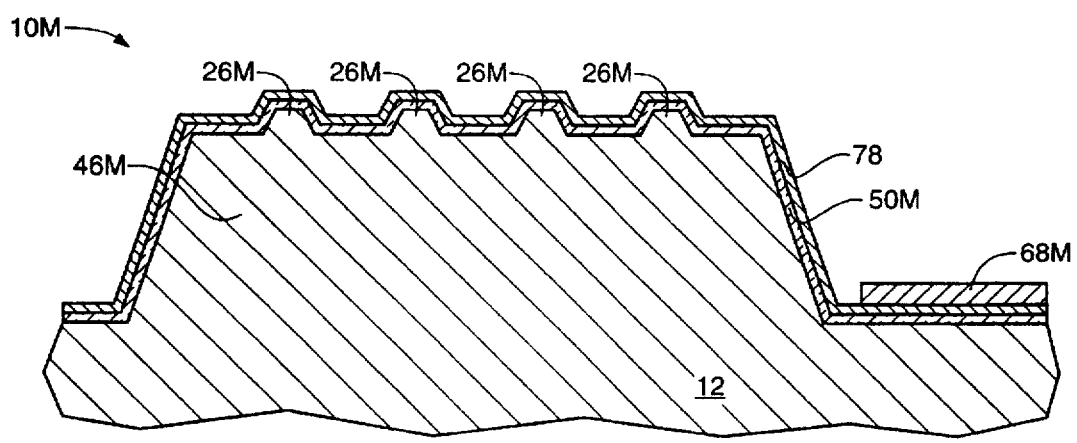
FIG. 5B is a cross sectional view illustrating the formation of the metal conductive layer.

Referring now to FIGS. 5A and 5B formation of an alternate embodiment interconnect 10M is illustrated. The alternate embodiment interconnect 10M includes a metal 78 (FIG. 5B) rather than a metal silicide conductive layer. FIG. 5A represent a stage in the fabrication process that is equivalent to the stage represented by FIG. 1M. At this stage of the process the contact member 46M and projections 26M have been formed in the same manner as contact member 46 using the same process steps as illustrated in FIGS. 1A–1L. After formation of the contact member 46M and projections 26M, an insulating layer 50M is formed on the contact member 46M and substrate 12M, as previously described.

Next, as shown in FIG. 5B a metal conductive layer 78 is formed on the contact member 46M. The metal conductive layer 78 is formed of a highly conductive metal such as aluminum, copper or a refractory metal or alloys of these metals. The metal conductive layer 78 can be deposited on the entire substrate 12M and then etched to form conductive traces as previously described. Alternately the metal conductive layer 78 and conductive traces 68M can be formed of different (or the same) metals using separate metallization processes (e.g., CVD deposition, photopatterning, etching).

Figure 6:
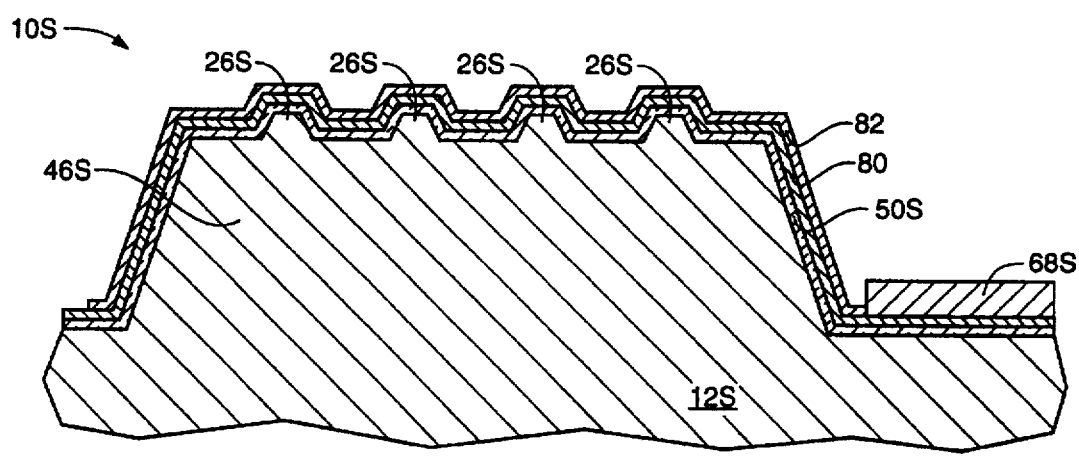
FIG. 6 is a cross sectional view illustrating the formation of a conductive layer as a bi-metal stack.

As shown in FIG. 6, an interconnect 10S can be formed with a conductive layer formed as a bi-metal stack. The bi-metal conductive layer includes a barrier layer 82 and a bonding layer 80. The barrier layer 82 is formulated to prevent formation of an oxide layer that would change the resistivity of the contact member 46S. In addition, the barrier layer 82 is formulated to prevent reaction of the conductive layer with the contact location on the die and prevent the diffusion of impurities from the contact location on the die to the bonding layer 80 and vice versa.

The barrier layer 82 is preferably a metal that will not easily form a "permanent" or "chemical" bond with a raised metal contact location on the die even under a large mechanical force (e.g., 10 lb./interconnect) and at high temperatures. In addition, this metal must be chemically stable (i.e., non reactive) for temperatures up to about 200° C. By way of example, the barrier layer 82 can be formed of a metal such as platinum (Pt), titanium (Ti) or a titanium alloy (e.g., TiN, TiW).

The bonding layer 80 is formulated to provide a good mechanical bond with conductive traces 68S that are subsequently formed on the substrate 12S out of a highly conductive material. By way of example, the bonding layer 80 can be formed of aluminum (Al), tungsten (W) or titanium (Ti). In some applications the bonding layer 80 can be formed of a same material as the conductive traces 68S using a single masking step.

Thus the invention provides an improved method for forming an interconnect having a self limiting contact structure. Although preferred materials have been described, it is to be understood that other materials may also be utilized. Furthermore, although the method of the invention has been described with reference to certain preferred embodiments, as will be apparent to those skilled in the art, certain changes and modifications can be made without departing from the scope of the invention as defined by the following claims.

What is claimed is:

1. A method for fabricating an interconnect for establishing an electrical connection with a contact location on a semiconductor die comprising:

providing a substrate;

forming a projection on the substrate configured to penetrate into the contact location to a limited penetration depth less than a thickness of the contact location;

etching a raised contact member on the substrate corresponding to the contact location on the die and including at least one projection;

forming an insulating layer on the substrate and contact member;

forming a metal silicide conductive layer on the contact member, said metal silicide conductive layer insulated from the substrate by the insulating layer; and forming a conductive trace on the substrate in contact with the metal silicide conductive layer.

2. The method as claimed in claim 1 and wherein the conductive trace surrounds a base portion of the contact member.

3. The method as claimed in claim 1 and wherein forming the projection is by etching the substrate.

4. The method as claimed in claim 1 and wherein etching the contact member is with an anisotropic etch process and the contact member is formed with sloped sidewalls.

5. The method as claimed in claim 1 and wherein forming the projection is by anisotropically etching the substrate and the projection is formed with sloped sidewalls.

6. The method as claimed in claim 1 and wherein forming the projection is by oxidizing the substrate to form an oxide layer and then removing the oxide layer.

7. The method as claimed in claim 1 and wherein forming the projection is by isotropically etching the substrate.

8. The method as claimed in claim 1 and wherein forming the metal silicide conductive layer is by reacting a silicon containing layer on the contact member with a metal layer, and then removing an unreacted portion of the metal layer.

9. The method as claimed in claim 1 and wherein the contact member includes a plurality of projections.

10. The method as claimed in claim 1 and wherein the projection has a generally pyramidal cross section with a flat tip portion.

11. A method for fabricating an interconnect for establishing an electrical connection with a contact location on a semiconductor die comprising:

providing a substrate;

forming a projection on the substrate, said projection configured to penetrate into the contact location to a limited penetration depth etching a raised contact member on the substrate corresponding to the contact location on the die and including at least one projection;

forming an insulating layer on the substrate and contact member;

forming a silicon containing layer on the contact member;

forming a metal layer on the silicon containing layer;

forming a metal silicide layer on the contact member by reacting the silicon containing layer with the metal layer; and forming conductive traces in contact with the metal silicide layer.

12. The method as claimed in claim 11 and further comprising:

forming the silicon containing layer on the contact member and also on the substrate;

forming a second insulating layer on the silicon containing layer; and removing the second insulating layer from the contact member prior to reacting the silicon containing layer.

13. The method as claimed in claim 11 and wherein the projection is formed by anisotropically etching the substrate.

14. The method as claimed in claim 11 and wherein the contact member includes a base portion and the conductive trace surrounds the base portion.

15. A method for fabricating an interconnect for establishing an electrical connection with a contact locations on a semiconductor die, comprising:

providing a substrate;

etching a projection on the substrate;

etching a raised contact member on the substrate with the projection projecting from a surface of the contact member and configured to penetrate the contact location to a depth less than a thickness of the contact location while the surface limits further penetration;

forming an insulating layer over the contact member and substrate;

forming a metal silicide layer on the contact member and projection by reaction of a metal layer and a silicon containing layer; and forming a conductive trace on the substrate in contact with the metal silicide layer.

16. The method as claimed in claim 15 and wherein the contact member is formed using an anisotropic etching process.

17. The method as claimed in claim 15 and wherein the contact member includes a base portion surrounded by the conductive trace.

18. The method as claimed in claim 15 and wherein the projection is formed by an anisotropic etch process and includes sloped sidewalls and a flat tip portion.

19. The method as claimed in claim 15 and wherein the projection is formed by an isotropic etch process and includes radiused sidewalls and a pointed tip portion.

20. The method as claimed in claim 15 and wherein the projection is formed by forming a mask on the substrate and etching through an opening in the mask.

21. The method as claimed in claim 15 and further comprising forming a plurality of contact members on the substrate corresponding to a plurality of contact location on the die.

22. The method as claimed in claim 15 and wherein the contact member includes a plurality of projections arranged in a parallel spaced array sized to be within a peripheral area of the contact location on the die.

23. The method as claimed in claim 15 and wherein the contact member includes a plurality of projections arranged in a pattern of nested rectangles sized to be within a peripheral area of the contact location on the die.

24. The method as claimed in claim 15 and wherein the contact member includes a plurality of projections arranged in a cross shaped pattern sized to be within a peripheral area of the contact location on the die.

25. The method as claimed in claim 15 and wherein the contact member includes a plurality of projections arranged in a spoke-like pattern sized to be within a peripheral area of the contact location on the die.

26. The method as claimed in claim 15 and wherein the projection is formed with a height of from 2000 Å to 5000 Å.

27. The method as claimed in claim 15 and wherein the projection is formed with a height that is about ¼ to ½ the thickness of the contact location on the die.

28. The method as claimed in claim 15 and further comprising testing the semiconductor die by applying test signals through the contact member.

29. A method for fabricating an interconnect for establishing an electrical connection with a contact location on a semiconductor die, comprising:

providing a substrate;

etching projections and raised contact members on the substrate, said contact members etched in a pattern that corresponds to a pattern of the contact locations on the die, each contact member including at least one projection adapted to penetrate a respective contact location on the die to a limited penetration depth that is less than a thickness of the contact location;

forming an insulating layer over the contact members and substrate;

forming a conductive layer on the contact members and projections; and forming a conductive trace in contact with the conductive layer.

30. The method as claimed in claim 29 and wherein the conductive layer comprises a metal silicide.

31. The method as claimed in claim 29 and wherein the conductive layer comprises a bi-metal stack.

32. A method for fabricating an interconnect for making an electrical connection with a contact location on a semiconductor die comprising:

providing a substrate;

forming a raised contact member on the substrate;

forming a plurality of projections on the contact member, said projections extending from a surface of the contact member and configured to penetrate into the contact location while the surface limits further penetration;

forming a conductive layer on the contact member and projections; and forming a conductive trace on the substrate in contact with the conductive layer.

33. The method as claimed in claim 32 and wherein the conductive layer comprises a metal silicide.

34. The method as claimed in claim 32 and wherein the conductive layer comprises a bi-metal stack.

35. The method as claimed in claim 32 and wherein the conductive layer is formed using a silicide process.

36. The method as claimed in claim 32 and wherein the projections are formed as elongated blades.

37. The method as claimed in claim 32 and wherein the projections and contact members are formed by etching the substrate.

38. The method as claimed in claim 32 and wherein the projections are formed in a pattern that is contained within a peripheral area of the contact location on the die.

39. A method for fabricating an interconnect for making an electrical connection with a contact location on a semiconductor die comprising:

providing a substrate;

forming a raised contact member on the substrate;

forming a projection on the contact member, said projection extending from a surface of the contact member with a height of from 2000 Å to 5000 Å, said projection configured to penetrate into the contact location to a depth less than a thickness of the contact location;

forming a conductive layer on the contact member and projections, said conductive layer insulated from the substrate by an insulating layer; and forming a conductive trace on the substrate in contact with the conductive layer.

40. The method as claimed in claim 39 and wherein the conductive layer comprises a metal silicide.

41. The method as claimed in claim 39 and wherein the conductive layer comprises a bi-metal stack.

* * * * *